US010784107B2

(12) United States Patent
Mallick et al.

(10) Patent No.: US 10,784,107 B2
(45) Date of Patent: Sep. 22, 2020

(54) METHODS OF FORMING TUNGSTEN PILLARS

(71) Applicant: Applied Materials, Inc., Santa Clara, CA (US)

(72) Inventors: Abhijit Basu Mallick, Palo Alto, CA (US); Pramit Manna, Sunnyvale, CA (US); Yihong Chen, San Jose, CA (US); Ziqing Duan, San Jose, CA (US); Rui Cheng, Santa Clara, CA (US); Shishi Jiang, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/969,119

(22) Filed: May 2, 2018

(65) Prior Publication Data
US 2018/0323068 A1    Nov. 8, 2018

Related U.S. Application Data

(60) Provisional application No. 62/500,213, filed on May 2, 2017.

(51) Int. Cl.
| | |
|---|---|
| *H01L 21/3065* | (2006.01) |
| *H01L 21/3105* | (2006.01) |
| *H01L 21/321* | (2006.01) |
| *H01L 21/033* | (2006.01) |
| *H01L 21/768* | (2006.01) |
| *H01L 21/3215* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76877* (2013.01); *H01L 21/76889* (2013.01); *H01L 21/3215* (2013.01)

(58) Field of Classification Search
CPC .......... H01L 21/3065; H01L 21/31056; H01L 21/32115
See application file for complete search history.

(56) References Cited

U.S. PATENT DOCUMENTS

| | | | | |
|---|---|---|---|---|
| 6,015,986 A | * | 1/2000 | Schuegraf | H01L 27/10852 257/298 |
| 8,048,782 B1 | * | 11/2011 | Ovshinsky | C23C 16/24 257/E21.297 |
| 8,357,613 B2 | | 1/2013 | Choi et al. | |
| 8,575,753 B2 | | 11/2013 | Choi et al. | |
| 2002/0055242 A1 | * | 5/2002 | Uhlenbrock | C23C 16/18 438/584 |
| 2003/0022528 A1 | * | 1/2003 | Todd | B82Y 10/00 438/341 |
| 2005/0245073 A1 | * | 11/2005 | Lee | H01L 21/02063 438/629 |

(Continued)

*Primary Examiner* — Thomas T Pham
(74) *Attorney, Agent, or Firm* — Servilla Whitney LLC

(57) ABSTRACT

Methods of forming self-aligned patterns are described. A film material is deposited on a patterned film to fill and cover features formed by the patterned film. The film material is recessed to a level below the top of the patterned film. The recessed film is converted to a metal film by exposure to a metal precursor followed by volumetric expansion of the metal film.

12 Claims, 3 Drawing Sheets

(56) References Cited

U.S. PATENT DOCUMENTS

| | | | |
|---|---|---|---|
| 2013/0302980 A1* | 11/2013 | Chandrashekar | ............................ H01L 21/76877 438/666 |
| 2016/0204118 A1* | 7/2016 | Wu | ..................... H01L 29/7881 257/316 |
| 2018/0130657 A1 | 5/2018 | Duan et al. | |

* cited by examiner

METHODS OF FORMING TUNGSTEN PILLARS

CROSS-REFERENCE TO RELATED APPLICATIONS

This application claims priority to U.S. Provisional Application No. 62/500,213, filed May 2, 2017, the entire disclosure of which is hereby incorporated by reference herein.

TECHNICAL FIELD

The present disclosure relates generally to methods of depositing and processing thin films. In particular, the disclosure relates to processes for filling trenches in substrates.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications. Selective deposition methods typically include depositing a mask material on a substrate and patterning the mask material to form a patterned mask. Regions of the substrate may then be exposed though the patterned mask after the patterning of the mask. The patterned mask may be removed from the substrate to expose non-implanted regions of the substrate and a material may be selectively deposited on selected regions of the substrate.

There is a need in the art for new methods for chip designs with smaller critical dimensions. Additionally, there is an ongoing need for high quality metal oxide films for hardmasks and spacer applications, as well as methods for forming patterned films on substrates.

SUMMARY

One or more embodiments of the disclosure are directed to processing methods comprising providing a substrate surface with a patterned film forming at least one feature. The at least one feature extends a depth from a top surface of the patterned film to a bottom surface. The at least one feature has a width defined by a first sidewall and a second sidewall. A film is deposited on the patterned film to fill the at least one feature and extend above the top surface of the patterned film. The film is recessed to lower a top of the film to a height equal to or below the top surface of the patterned film to form a recessed film. The recessed film is converted to a tungsten film. The tungsten film is expanded to form pillars extending from the at least one feature.

Additional embodiments of the disclosure are directed to processing methods comprising providing a substrate surface with a patterned film forming at least one feature. The at least one feature extends a depth from a top surface to a bottom surface and has a width defined by a first sidewall and a second sidewall. The substrate surface is exposed to a silicon precursor comprising one or more of silane, disilane, trisilane or tetrasilane to deposit an amorphous silicon film by thermal decomposition on the substrate surface to fill the at least one feature and extend above the substrate surface. The amorphous silicon film is etched with a hydrogen plasma or hydrogen radicals to recess the amorphous silicon film to lower a top of the film to a height equal to or below the top surface of the patterned film to form a recessed amorphous silicon film. The recessed amorphous silicon film is exposed to a tungsten precursor to react with the recessed amorphous silicon film to convert substantially all of the amorphous silicon film to a tungsten film. The tungsten film is oxidized to expand the tungsten film to form tungsten pillars that extending substantially straight up from the at least one feature.

Further embodiments of the disclosure are directed to processing methods comprising providing a substrate surface with a patterned film forming at least one feature. The at least one feature extends a depth from a top surface to a bottom surface and has a width defined by a first sidewall and a second sidewall. The substrate surface is exposed to a silicon precursor comprising one or more of silane, disilane, trisilane or tetrasilane to deposit an amorphous silicon film by thermal decomposition on the substrate surface to fill the at least one feature and extend above the top surface of the patterned film. The thermal decomposition occurs without a silicon co-reactant and at a temperature in the range of about 300° C. to about 550° C. without a plasma or at a temperature in the range of about −100° C. to about 50° C. with a plasma. The amorphous silicon film is etched with a hydrogen plasma or hydrogen radicals to recess the amorphous silicon film to lower a top of the film to a height equal to or below the top surface of the patterned film to form a recessed amorphous silicon film. The recessed amorphous silicon film is exposed to a tungsten precursor comprising $WF_6$ at a temperature in the range of about 300° C. to about 550° C. to react with the recessed amorphous silicon film to convert substantially all of the amorphous silicon film to a tungsten film. The tungsten film is oxidized to expand the tungsten film to form tungsten pillars that extending substantially straight up from the at least one feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for depositing metal oxide films for any conformal, nonconformal and/or low to high aspect ratio self-aligned patterning or gap/trench/void filling applications. Embodiments of the disclosure advantageously provide methods of depositing a film (e.g., a metal oxide film) in high aspect ratio (AR) structures with small dimensions. Some embodiments of the disclosure advantageously provide methods of filling gaps without formation of a seam in the gap. One or more embodiments of the disclosure advantageously provide methods of forming self-aligned patterns.

Figure 1:
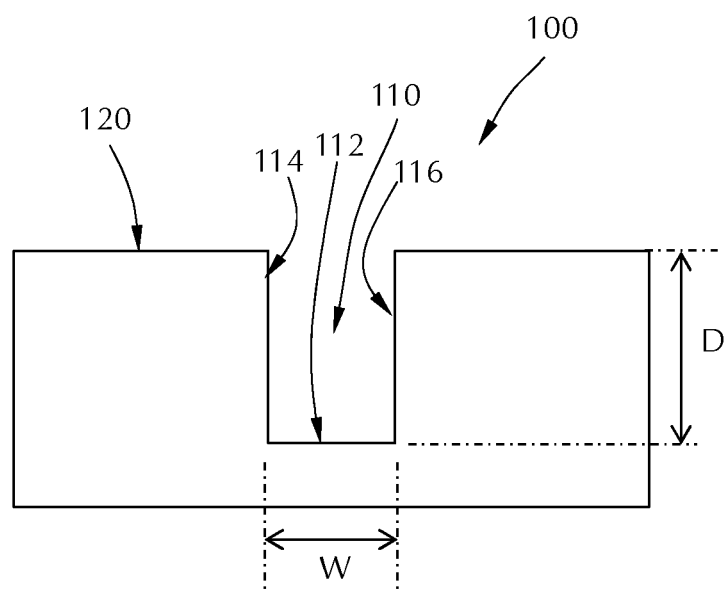
FIG. 1 shows a cross-sectional view of a substrate feature in accordance with one or more embodiments of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features or trenches can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 2A:
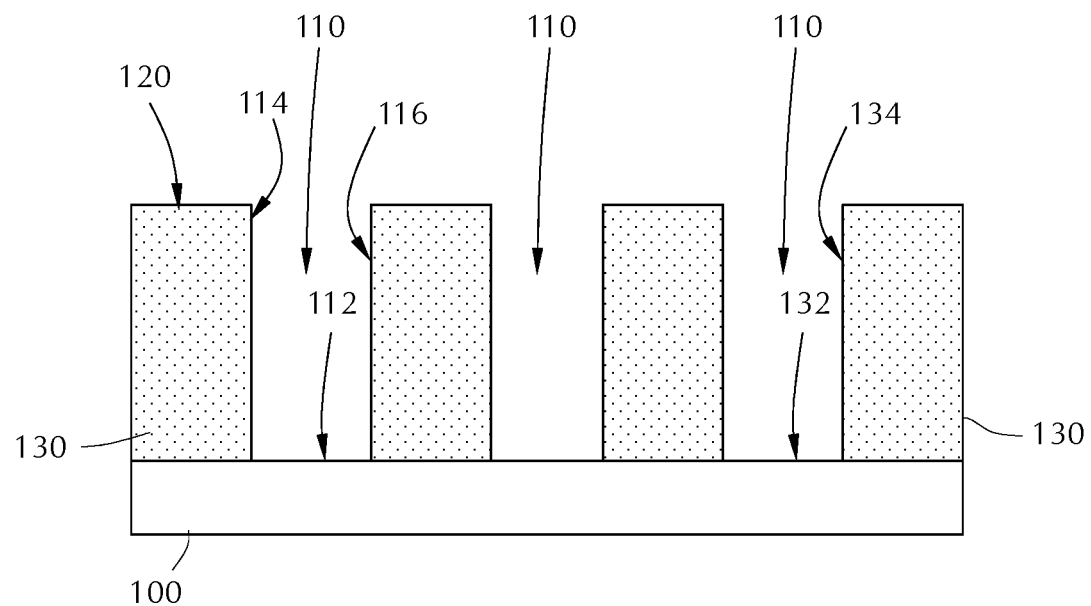
FIGS. 2A through 2E show a cross-sectional schematic of a gapfill process in accordance with one or more embodiments of the disclosure.

The substrate 100 has a top surface 120. The at least one feature 110 forms an opening in the top surface 120. The feature 110 extends from the top surface 120 to a depth D to a bottom surface 112. The feature 110 has a first sidewall 114 and a second sidewall 116 that define a width W of the feature 110. The open area formed by the sidewalls and bottom are also referred to as a gap. While the feature 110 is illustrated as a trench formed in a single component substrate 100, those skilled in the art will recognize that the feature 110 can be formed by a patterned film on the substrate 100. FIG. 2A shows an embodiment in which features 110 are formed as trenches or vias formed by or within patterned film 130.

Figure 2B:
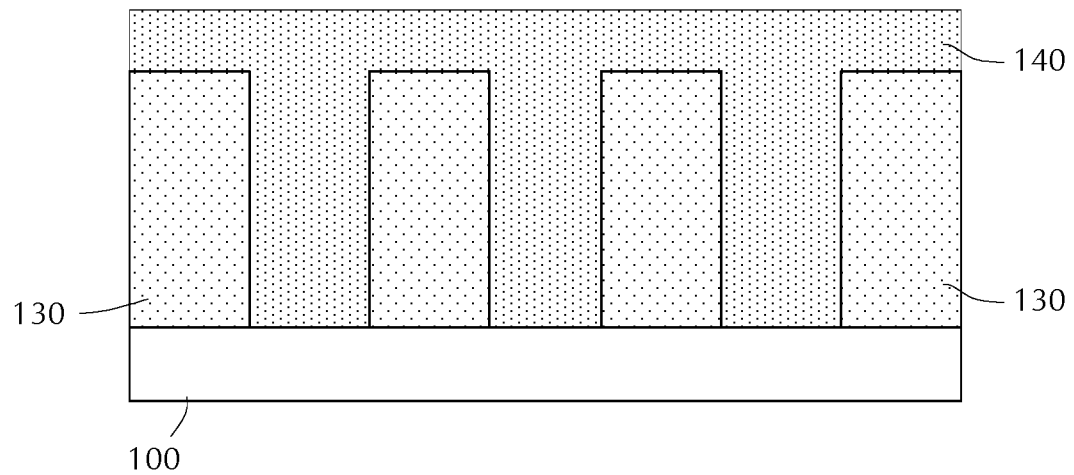
Figure 2C:
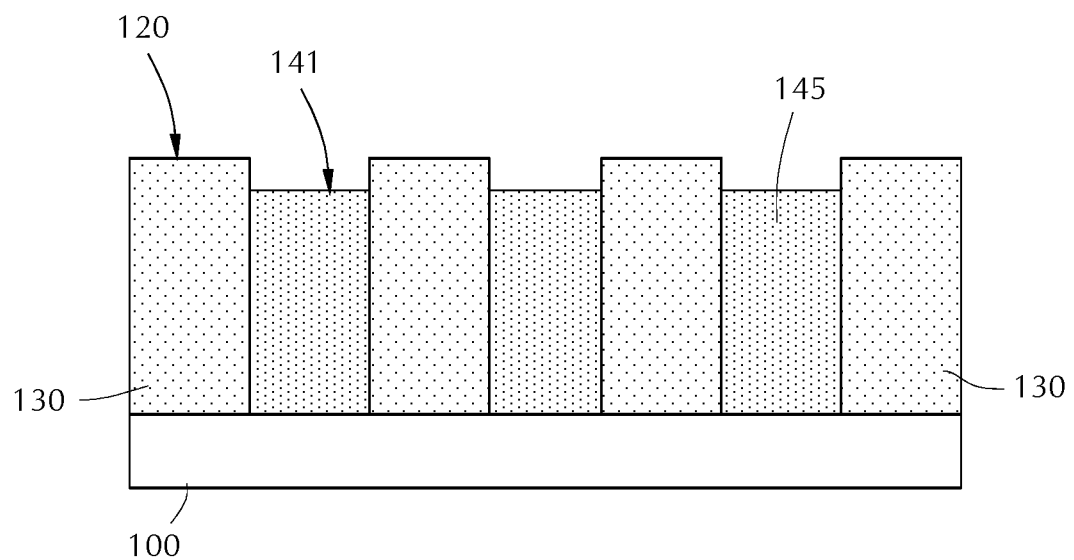

With reference to FIGS. 2A through 2C, an exemplary embodiment of the disclosure is described. The substrate 100 is provided for processing with or without the patterned film 130 formed thereon. As used in this regard, the term "provided" means that the substrate is placed into a position or environment for further processing. In some embodiments, the patterned film 130 is formed on the substrate 100 to provide the at least one feature 110. In some embodiments, the substrate 100 is provided with the patterned film 130 already present.

As illustrated in FIG. 2A, the patterned film can be a different material than the substrate 100 so that there is a first surface 132 and a second surface 134 different from the first surface 132. The features 110 are formed in the patterned film 130 so that the bottom 112 of the feature 110 provides the first surface 132 and the sidewalls 114, 116 and the top surface 120 of the feature 110 provide the second surface 134. The patterned film 130 can be any suitable material. The patterned film 130 of some embodiments comprises a low-k dielectric (e.g., SiOC). The patterned film 130 can be selected to be compatible with subsequent processing conditions.

In FIG. 2B, a film 140 is deposited or formed on the substrate 100 surface to fill the features 110 and extend above the top surface 120 of the patterned film 130. The film 140 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 140 is formed by atomic layer deposition or plasma-enhanced atomic layer deposition.

In some embodiments, the precursor is flowed into a processing chamber containing the substrate 100 with an inert, carrier and/or diluent gas. The precursor can chemisorb to the substrate 100 or patterned film 130 to leave a chemisorbed precursor on the substrate or patterned film. A co-reactant can then be flowed into the processing chamber to react with the chemisorbed precursor to deposit film 140. In some embodiments, the precursor is co-flowed into the processing chamber with a co-reactant. The precursor and co-reactant can react in the gas phase and form a species that deposit onto the substrate or patterned film to grow the film 140.

In some embodiments, the film 140 is deposited by thermal decomposition of a precursor. In some embodiments, the thermal decomposition does not include a co-reactant with the precursor to deposit the film 140. For example, a silicon precursor may be exposed to the substrate to deposit or form the film 140 on the substrate 100 and within the features 110.

In some embodiments, the film 140 comprises amorphous silicon. In one or more embodiments, the film 140 consists essentially of amorphous silicon. As used in this regard, the term "consists essentially of" means that the film is greater than or equal to about 95%, 98% or 99% amorphous silicon, on a molar basis.

Forming the amorphous silicon film can be accomplished by any suitable technique. In some embodiments, forming the amorphous silicon film is accomplished by thermal decomposition of a silicon precursor without a co-reactant, or substantially without a co-reactant. As used in this regard, the term "substantially without a co-reactant" means that any species that reacts with the silicon precursor, or adsorbed precursor molecules is present in an amount less than or equal to about 50%, 40%, 30%, 20%, 10% or 5% of a stoichiometric amount for reaction.

In some embodiments, the amorphous silicon film is deposited using one or more of silane, disilane, trisilane or tetrasilane. In some embodiments, a higher order silane (e.g., greater than or equal to five, six, seven, eight, nine or ten silicon atoms) can be used to deposit the amorphous silicon film.

In some embodiments, the amorphous silicon film is deposited by a conformal deposition process in which the silicon precursor is exposed to the substrate 100 and any patterned film 130 at temperatures and pressures sufficient to promote thermal decomposition of the precursor. In some embodiments, the temperature during deposition is in the range of about 300° C. to about 550° C., or in the range of about 350° C. to about 500° C. In some embodiments, the pressure during deposition is in the range of about 10 T to about 600 T, or in the range of about 50 T to about 500 T, or in the range of about 100 T to about 400 T. The deposition of the amorphous silicon film by a conformal deposition process can occur with or without plasma exposure. In some embodiments, the conformal deposition process occurs without plasma exposure.

In some embodiments, the amorphous silicon film is deposited by a flowable film deposition process. The temperature during the flowable film deposition process can be in the range of about −100° C. to about 50° C., or in the range of about −50° C. to about 25° C. In some embodiments, the flowable film deposition process occurs at a pressure in the range of about 1 torr to about 10 torr. In one or more embodiments, the flowable film deposition process includes plasma exposure using an RF plasma with a power in the range of about 10 W to about 200 W. The plasma can be a conductively coupled plasma (CCP) or an inductively coupled plasma (ICP).

As shown in FIG. 2C, after deposition, the film 140 is recessed to form a recessed film 145 with a top 141. The top 141 is lowered to a height equal to or below the top surface 120 of the patterned film 130. In some embodiments, the recessed film 145 has a top 141 that is substantially coplanar with the top surface 120 of the patterned film 130. As used in this manner, the term "substantially coplanar" means that the top 141 is within 1 Å of the top surface 120 of the patterned film 130. In some embodiments, the top 141 of the recessed film 145 is in the range of about 20% to about 98% of the height of the patterned film 130. In some embodiments, the top 141 of the recessed film 145 is in the range of about 30% to about 95%, or in the range of about 40% to about 90%, or in the range of about 50% to about 85% of the height of the patterned film 130.

Recessing the film 140 to form the recessed film 145 can be accomplished by any suitable technique. In some embodiments, recessing the film 140 comprises etching the film 140. In some embodiments, etching comprises a reactive ion etch (RIE) process. In some embodiments, the RIE uses a bromine based etchant. In one or more embodiments, etching the film 140 comprises exposing the film 140 to a hydrogen plasma or hydrogen radicals. The hydrogen plasma can be a remote plasma or a direct plasma and can be a CCP or ICP. In hydrogen radicals can be generated by any suitable means including, plasma generation or by flowing the etchant across a hot wire to generate radicals.

Figure 2D:
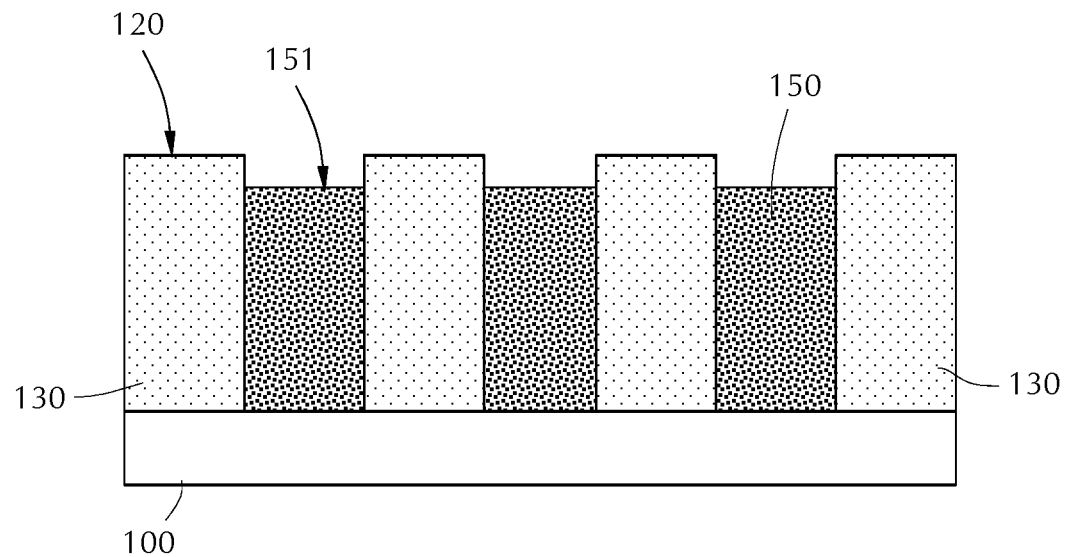

The recessed film 145 is converted to a tungsten film 150, as illustrated in FIG. 2D. Conversion of the recessed film can be accomplished by any suitable reaction. In some embodiments, the recessed film is converted to a tungsten film by exposure to a tungsten precursor. The tungsten precursor can be, for example, a tungsten halide that can react with the recessed film to exchange tungsten atoms for silicon atoms.

In some embodiments, the tungsten precursor comprises $WF_6$. In some embodiments, exposure to the tungsten precursor occurs at a temperature in the range of about 300° C. to about 550° C. and a pressure in the range of about 10 torr to about 100 torr. The tungsten precursor can be co-flowed with other gases that can be diluent, carrier or inert gases (e.g., argon) or reactive gases (e.g., $H_2$). In some embodiments, the tungsten precursor is co-flowed with a reactive gas that promotes the reaction of the tungsten precursor with the recessed film.

In an exemplary embodiment, the recessed film 145 comprises, or consists essentially of, amorphous silicon and the tungsten precursor comprises $WF_6$. The tungsten precursor is exposed to the amorphous silicon film at a temperature of about 550° C. and a pressure of about 20 Torr.

In some embodiments, substantially all of the recessed film is converted to tungsten. As used in this regard, the term "substantially all" means greater than or equal to about 95%, 98% or 99% of the recessed film is converted to tungsten. The amount of time employed to convert substantially all of the recessed film depends on, for example, the temperature, pressure, film composition, film thickness and tungsten precursor. In some embodiments, 200-300 Å of amorphous silicon can be converted to tungsten in less than about four minutes at 550° C. and 20 Torr.

After converting the recessed film 145 to tungsten 150, the height of the top 151 of the tungsten film 150 can be the same as the height of the recessed film, or different. The height of the tungsten film 150 relative to the recessed film depends on, for example, the species present in the films and the atomic radii of the species. In some embodiments, the height of the tungsten film 150 is such that the top 151 of the film 150 is equal to or below the top surface 120 of the patterned film 130.

Figure 2E:
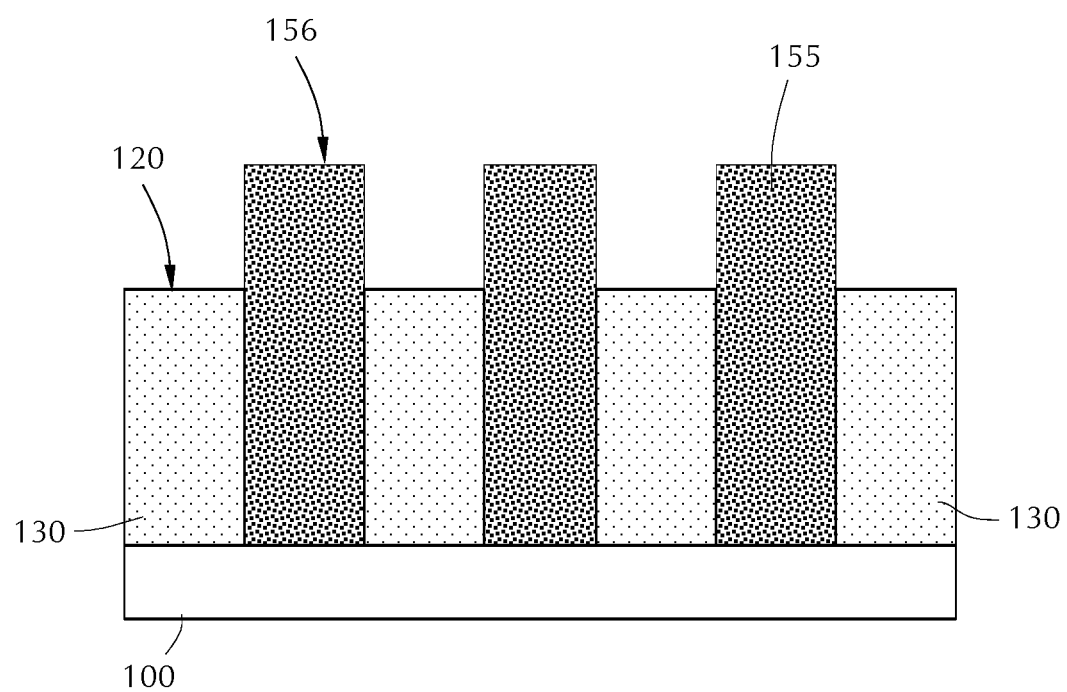

As shown in FIG. 2E, the tungsten film 150 can be expanded to cause volumetric expansion of the tungsten film 150 to form tungsten pillars 155 that extends from the top surface 120. The tungsten pillars 155 of some embodiments extend straight up from the surface 120. The expansion of the film 150 can be in the range of about 10% to about 1000%, or in the range of about 50% to about 800%, or in the range of about 100% to about 700%. In some embodiments, the film 130 expands by an amount greater than or equal to about 150%, 200%, 250%, 300% or 350%. In some embodiments, the film 150 expands an amount in the range of about 300% to about 400%. In some embodiments, the tungsten pillars 155 have a height greater than the tungsten film 150 by an amount equal to or greater than about 50%, 60%, 70%, 80%, 90%, 100%, 125%, 150%, 175% or 200% of the height of the tungsten film 150.

In some embodiments, the film 150 is expanded by exposure to a siliciding agent or siliciding conditions to convert the metal or metal containing film to a metal silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. In some embodiments, the siliciding conditions comprise a thermal siliciding, plasma enhanced siliciding, remote plasma siliciding, microwave and radio-frequency (e.g., ICP, CCP).

In some embodiments, the film 150 is expanded by exposure to a germanium agent or germaniciding conditions to convert the metal or metal containing film to a metal germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. In some embodiments, the germaniciding conditions comprise a thermal germaniciding, plasma enhanced germaniciding, remote plasma germaniciding, microwave and radio-frequency (e.g., ICP, CCP).

As shown in FIG. 2E, during expansion, the fidelity of the feature shape is maintained on the top of the feature so that the film 150 grows straight up from the feature 110. As used in this regard, "straight up" means that the sides of the expanded film or pillars 155 are substantially coplanar with the sidewall 114, 116 of the feature 110. A surface is coplanar with the sidewall 114 where the angle formed at the junction of the sidewall 114 and the surface is ±10°.

In some embodiments, the tungsten film 150 is doped with a dopant prior to expansion. The dopant can be incorporated into the tungsten film 150 at the same time as the formation of the tungsten film 150 or in a separate process sequentially with the film deposition. For example, depositing the tungsten film 150 may occur followed by doping the tungsten film 150 with the dopant in a separate process in either the same process chamber or a different process chamber.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
providing a substrate surface with a patterned film forming at least one feature, the at least one feature extending a depth from a top surface of the patterned film to a bottom surface, the at least one feature having a width defined by a first sidewall and a second sidewall;
depositing an amorphous silicon film on the patterned film at a temperature in the range of about −100° C. to about 50° C. to fill the at least one feature and extend above the top surface of the patterned film, depositing the amorphous silicon film comprise exposing the substrate surface to a precursor comprising one or more of silane, disilane, trisilane or tetrasilane;
recessing the amorphous silicon film to lower a top of the amorphous silicon film to a height equal to or below the top surface of the patterned film to form a recessed film;
converting the recessed film to a tungsten film; and
expanding the tungsten film to form pillars extending from the at least one feature.

2. The method of claim 1, wherein depositing the film occurs at a pressure in the range of about 1 torr to about 10 torr.

3. The method of claim 2, wherein depositing the film occurs with an RF plasma having a power in the range of about 10 W to about 200 W.

4. The method of claim 3, wherein depositing the film occurs without a co-reactant for the precursor.

5. The method of claim 1, wherein recessing the film comprises etching the film.

6. The method of claim 5, wherein etching the film comprises a reactive ion etch process using a bromine based etchant.

7. The method of claim 5, wherein recessing the film comprises exposing the film to a hydrogen plasma or hydrogen radicals.

8. The method of claim 1, wherein converting the recessed film to a tungsten film comprises exposing the recessed film to $WF_6$.

9. The method of claim 8, wherein exposure to $WF_6$ occurs at a temperature in the range of about 300° C. to about 550° C. and a pressure in the range of about 10 torr to about 100 torr.

10. The method of claim 9, wherein substantially all of the recessed film is converted to tungsten.

11. The method of claim 1, wherein expanding the tungsten film comprises oxidizing the tungsten film.

12. The method of claim 11, wherein the pillars extend substantially straight up from the feature.

* * * * *